US006942950B2

(12) United States Patent
Lobo et al.

(10) Patent No.: US 6,942,950 B2
(45) Date of Patent: Sep. 13, 2005

(54) PROTECTIVE OVERCOAT AND PROCESS FOR THERMAL DYE SUBLIMATION PRINTS

(75) Inventors: Rukmini B. Lobo, Webster, NY (US); David C. Boris, Webster, NY (US); Scott A. Strong, Honeoye, NY (US); Anita M. Fees, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 96 days.

(21) Appl. No.: 10/229,300

(22) Filed: Aug. 26, 2002

(65) Prior Publication Data

US 2004/0038823 A1 Feb. 26, 2004

(51) Int. Cl.[7] .......................... G03C 11/08; G03F 7/34; B32B 15/02; B32B 23/02; B41M 3/12

(52) U.S. Cl. ......................... 430/14; 430/259; 430/961; 156/240; 427/147; 428/403; 428/404; 428/914; 503/227

(58) Field of Search .......................... 430/14, 259, 961; 503/227; 156/240; 427/147; 428/403, 404, 914

(56) References Cited

U.S. PATENT DOCUMENTS

| | | | | |
|---|---|---|---|---|
| 5,652,091 | A | * | 7/1997 | Perry et al. |
| 5,674,805 | A | * | 10/1997 | Simpson et al. |
| 5,770,353 | A | * | 6/1998 | Wang et al. |
| 5,858,634 | A | * | 1/1999 | Wang et al. |
| 5,965,339 | A | * | 10/1999 | Smith et al. |
| 6,048,677 | A | * | 4/2000 | Chen et al. |
| 6,071,688 | A | * | 6/2000 | Moose et al. |
| 6,184,181 | B1 | * | 2/2001 | Lum et al. |
| 6,346,502 | B1 | | 2/2002 | Simpson et al. |
| 6,509,384 | B2 | * | 1/2003 | Kron et al. |
| 2001/0005572 | A1 | * | 6/2001 | Lobo et al. |

OTHER PUBLICATIONS

W. H. Simpson, et al, "Protective Laminate and Process for Thermal Dye Sublimation Prints", U.S. Appl. No. 10/180, 745 (D–84106) filed Jun. 26, 2002.

* cited by examiner

*Primary Examiner*—Richard L. Schilling
(74) *Attorney, Agent, or Firm*—Arthur E. Kluegel; Chris P. Konkol

(57) ABSTRACT

Disclosed is a protective transparent overcoat comprising a protective polymer and a surfactant compound having multiple non-end-group hydrogen bonding groups directly or indirectly bonded to the backbone chain of the surfactant compound. The coating enables simplified manufacturing of a thermal sublimation dye transfer donor of high quality.

25 Claims, No Drawings

PROTECTIVE OVERCOAT AND PROCESS FOR THERMAL DYE SUBLIMATION PRINTS

FIELD OF THE INVENTION

This invention relates to a protective transparent overcoat comprising a protective polymer and a surfactant compound having multiple hydrogen bonding groups directly or indirectly bonded to the backbone chain of the surfactant compound. The coating enables simplified manufacturing of a thermal sublimation dye transfer donor of high quality.

BACKGROUND OF THE INVENTION

In recent years, thermal transfer systems have been developed to obtain prints from pictures that have been generated electronically from a color video camera. According to one way of obtaining such prints, an electronic picture is first subjected to color separation by color filters. The respective color-separated images are then converted into electrical signals. These signals are then operated on to produce cyan, magenta and yellow signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to one of the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Thermal prints are susceptible to retransfer of dyes to adjacent surfaces and to discoloration by fingerprints. This is due to dye being at the surface of the dye-receiving layer of the print. These dyes can be driven further into the dye-receiving layer by thermally fusing the print with either hot rollers or a thermal head. This will help to reduce dye retransfer and fingerprint susceptibility, but does not eliminate these problems. However, the application of a protective overcoat will practically eliminate these problems. This protective overcoat is applied to the receiver element by heating in a likewise manner after the dyes have been transferred. The protective overcoat will improve the stability of the image to light fade and oil from fingerprints.

In a thermal dye transfer printing process, it is desirable for the finished prints to compare favorably with color photographic prints in terms of image quality. The look of the final print is very dependent on the surface texture and gloss. Typically, color photographic prints are available in surface finishes ranging from very smooth, high gloss to rough, low gloss matte.

If a matte finish is desired on a thermal print, it has been previously accomplished by using matte sprays or by matte surface applications through post printing processors. However, both of these solutions are costly and add a degree of complexity to the process.

U.S. Pat. No. 6,346,502 and JP 09/323482 relate to the use of expandable microspheres in a transferable protection layer area of a dye-donor element. However, there is a problem with these microspheres in that they will not provide a defect-free print with a desired gloss at a low print head temperature.

The transferable protection layer of the dye donor is manufactured by a gravure coating process between the temperatures of 12° C. and 49° C. (55° F. and 120° F.), preferably between 18° C. and 38° C. (65° F. and 100° F.). A coating melt or solution is prepared from a solvent soluble polymer and thermally expandable microspheres or beads and is transferred in the liquid state from the etching of the gravure cylinder to the dye donor support. The unengraved area of the cylinder must be kept free of any accumulation of liquid coating melt such that unwanted transfer of liquid to the dye donor support is avoided. Such transfer leads to undesirable contamination of the dye donor support when subsequent patches of dye are coated.

Inorganic particles such as colloidal silica is added to the surface of the expandable beads during manufacture to prevent coalescence of the oil phase droplets during manufacture and agglomeration of the dry microspheres during storage. The dispersed microspheres typically bear on the surface of the microspheres inorganic particles in an amount of at least 1.8% by weight of the microspheres. The colloidal silica progressively forms a scum on the surface of the gravure cylinder. The scum builds up with time to a point where the coating machine must eventually be shut down and the scummed cylinder replaced with a clean cylinder because of the unwanted transfer of liquid coating melt to the donor web described above.

Materials constituting the coating composition useful for creating a matte finish protective overcoat layer for a thermal dye transfer image are described in U.S. Pat. No. 6,184,181 B1, by Lum et al, and subsequently by Simpson et al. in published GB 2,348,509. The materials are combined in a multiple-solvent coating composition, to provide the overcoat layer as a repeating patch in the multicolor dye-donor element containing patches of cyan, magenta and yellow.

A multi-station gravure-coating machine is used to coat the multicolor dye-donor element as well as this matte-finish protective overcoat in sequentially registered patches. Contamination of any of the patches from one color to the next is not desirable for product quality. Any contamination from the protective overcoat layer coating cylinder to an area in the donor element where either the cyan, magenta or yellow dye is to be subsequently coated causes a failure in the making of the thermal dye transfer image. The contamination on the gravure coating process was seen to form fairly rapidly hindering the length of a successful production before interruption for cleaning.

Altering various process conditions is somewhat effective in extending the time between cleanings, but a further and more reliable method for extending the period is a problem to be solved.

SUMMARY OF THE INVENTION

The invention provides a protective transparent overcoat comprising a protective polymer and a surfactant compound having multiple non-end-group hydrogen bonding groups directly or indirectly bonded to the backbone chain of the surfactant compound. It also provides an improved dye donor element and a method for making the same.

Embodiments of the invention enable simplified manufacturing of a thermal sublimation dye transfer donor of high quality

DETAILED DESCRIPTION OF THE INVENTION

The invention is summarized above. The overcoat or laminate contains inorganic particles, a polymeric binder and unexpanded synthetic thermoplastic polymeric microspheres, the microspheres having a particle size in the unexpanded condition of from about 5 to about 20 μm. By use of the invention, a dye-donor element is provided containing a transferable protection layer that is capable of giving a low gloss or matte surface to an image and can be coated with significant reduction in down time due to cylinder scumming.

As summarized, the protective transparent overcoat comprises a protective polymer and a surfactant compound having multiple non-end-group hydrogen bonding groups directly or indirectly bonded to the backbone chain of the surfactant compound. The surfactant compound may be polymeric, oligomeric, or non-polymeric. Suitably, the hydrogen bonding group may comprise a hydroxy group or a secondary amine group.

An example of a surfactant compound containing a hydroxy group is a surfactant having a poly (hydroxyalkyleneoxide) segment, such as Olin Surfactant 10G, provided by Olin Corp. The surfactant may also contain an alkylphenol segment such as an octyl- or nonylphenol derivative. Examples are those wherein the poly (hydroxyalkyleneoxide) segment contains at least 6 hydroxyalkyleneoxide groups, or at least 9 hydroxyalkyleneoxide groups, especially where the compound is a nonylphenol derivative.

The surfactant compound is suitably a nonionic sugar derivative, such as APG 325CS GLYCOSIDE supplied by Henkel Corp. Suitably it is an alkyl polyglycoside compound wherein the derivative contains an alkyl chain of 8 carbon atoms, desirably 8 to 16 carbon atoms and contains from 1 to 4 glycoside rings and exhibits an HLB of from 11 to 14.

Alternatively, the compound is a polyalkyleneimine such as SOLSPERSE 24,000 supplied by ICI. Such compound may contain, for example, alkyleneimine groups of 2–4 carbon atoms and such surfactants also typically contain a poly(carbonylalkyleneoxy) group. Polyethyleneimines as described in U.S. Pat. No. 5,395,743 are conveniently employed and the molecular weight of the compound is usually from 1,000 to 200,000, with ranges of 10,000 to 50,000 or 20,000 to 30,000 typically employed.

A process for manufacturing a dye donor element comprises depositing on the donor a releasable transparent protective overcoat containing a surfactant compound having multiple non-end-group hydrogen bonding groups directly or indirectly bonded to the backbone chain of the surfactant compound.

In a preferred embodiment of the invention a coating melt, containing thermally expandable beads containing the prescribed surfactant is used to produce a heat-transferable over-protective layer which can be patch coated with significantly improved downtime due to scumming of the coating cylinder.

In another preferred embodiment of the invention, the dye-donor element is a polychrome element and comprises repeating units of four or more areas, with one area comprising a heat transferable layer.

In another preferred embodiment of the invention, the dye-donor element is a monochrome element and comprises repeating units of two areas, the first area comprising a layer of one image dye dispersed in a binder, and the second area comprising the protection layer.

In another preferred embodiment of the invention, the dye-donor element is a black-and-white element and comprises repeating units of two areas, the first area comprising a layer of a mixture of image dyes dispersed in a binder to produce a neutral color, and the second area comprising the protection layer.

In a preferred embodiment of the invention, the expandable microspheres are white, spherically-formed, hollow particles of a thermoplastic shell encapsulating a low-boiling, vaporizable substance, such as a liquid, which acts as a blowing agent. When the unexpanded microspheres are heated, the thermoplastic shell softens and the encapsulated blowing agent expands, building pressure. This results in expansion of the microsphere.

The expandable microspheres employed in the invention may be formed by encapsulating isopentane, isobutane or any other low-boiling, vaporizable substance into a microcapsule of a thermoplastic resin such as a vinylidene chloride-acrylonitrile copolymer, a methacrylic acid ester-acrylonitrile copolymer or a vinylidene chloride-acrylic acid ester copolymer. These microspheres are available commercially as Expancel® Microspheres 461-20-DU, 6–9 μm particle diameter weighted average, (Expancel Inc.); Expancel® Microspheres 461-DU, 9–15 μm particle diameter weighted average, (Expancel Inc.); and Expancel® Microspheres 091-DU, 10–16 μm particle diameter weighted average, (Expancel Inc.).

The present invention provides a protection overcoat layer on a thermal print by uniform application of heat using a thermal head. After transfer to the thermal print, the protection layer provides superior protection against image deterioration due to exposure to light, common chemicals, such as grease and oil from fingerprints, and plasticizers from film album pages or sleeves made of poly(vinyl chloride). The protection layer is generally applied at coverage of at least about 0.03 $g/m^2$ to about 1.5 $g/m^2$ to obtain a dried layer of less than 1 μm.

As noted above, the transferable protection layer comprises the microspheres dispersed in a polymeric binder. Many such polymeric binders have been previously disclosed for use in protection layers. Examples of such binders include those materials disclosed in U.S. Pat. No. 5,332,713, the disclosure of which is hereby incorporated by reference. In a preferred embodiment of the invention, poly(vinyl acetal) is employed.

Inorganic particles are present in the protection layer of the invention. There may be used, for example, silica, titania, alumina, antimony oxide, clays, calcium carbonate, talc, etc. as disclosed in U.S. Pat. No. 5,387,573. In a preferred embodiment of the invention, the inorganic particles are silica. The inorganic particles improve the separation of the laminated part of the protection layer from the unlaminated part upon printing.

In a preferred embodiment of the invention, the protection layer contains from about 5% to about 60% by weight inorganic particles (not on the beads), from about 25% to about 60% by weight polymeric binder and from about 5% to about 60% by weight of the unexpanded synthetic thermoplastic polymeric microspheres.

In use, yellow, magenta and cyan dyes are thermally transferred from a dye-donor element to form an image on the dye-receiving sheet. The thermal head is then used to transfer the clear protection layer, from another clear patch on the dye-donor element or from a separate donor clement, onto the imaged receiving sheet by uniform application of heat. The clear protection layer adheres to the print and is released from the donor support in the area where heat is applied.

Any dye can be used in the dye layer of the dye-donor element of the invention provided it is transferable to the dye-receiving layer by the action of heat. Especially good results have been obtained with sublimable dyes. Examples of sublimable dyes include anthraquinone dyes, e.g., Sumikaron Violet RS® (Sumitomo Chemical Co., Ltd.), Dianix Fast Violet 3R FS® (Mitsubishi Chemical Industries, Ltd.), and Kayalon Polyol Brilliant Blue N BGM® and KST Black 146® (Nippon Kayaku Co., Ltd.); azo dyes such as Kayalon Polyol Brilliant Blue BM®, Kayalon Polyol Dark Blue 2BM®, and KST Black KR® (Nippon Kayaku Co., Ltd.), Sumikaron Diazo Black 5G® (Sumitomo Chemical Co., Ltd.), and Miktazol Black 5GH® (Mitsui Toatsu Chemicals, Inc.); direct dyes such as Direct Dark Green B® (Mitsubishi Chemical Industries, Ltd.) and Direct Brown M® and Direct Fast Black D® (Nippon Kayaku Co. Ltd.); acid dyes such as Kayanol Milling Cyanine 5R® (Nippon Kayaku Co. Ltd.); basic dyes such as Sumiacryl Blue 6G® (Sumitomo Chemical Co., Ltd.), and Aizen Malachite Green® (Hodogaya Chemical Co., Ltd.);

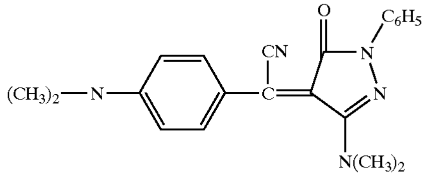

(magenta)

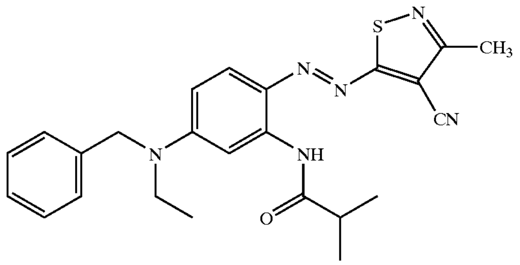

(magenta)

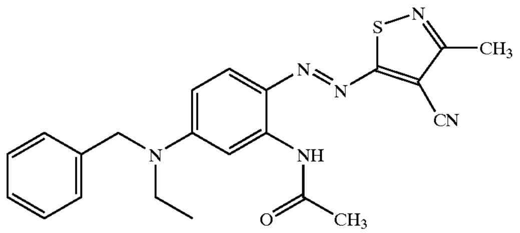

(magenta)

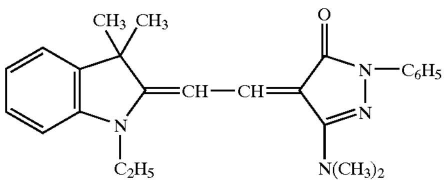

(yellow)

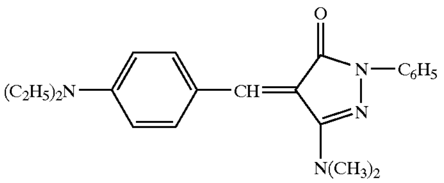

(yellow)

-continued

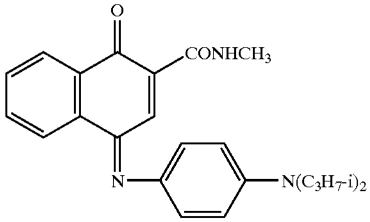

(cyan)

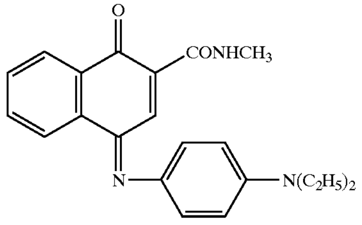

(cyan)

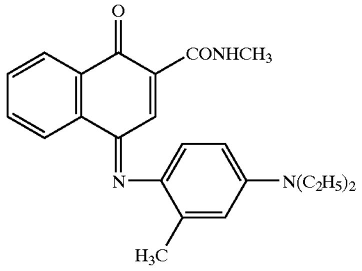

(cyan)

or any of the dyes disclosed in U.S. Pat. No. 4,541,830, the disclosure of which is hereby incorporated by reference. The above dyes may be employed singly or in combination to obtain a monochrome. The dyes may be used at a coverage of from about 0.05 to about 1 g/m$^2$ and are preferably hydrophobic.

A dye-barrier layer may be employed in the dye-donor elements of the invention to improve the density of the transferred dye. Such dye-barrier layer materials include hydrophilic materials such as those described and claimed in U.S. Pat. No. 4,716,144.

The dye layers and protection layer of the dye-donor element may be coated on the support or more typically printed thereon by a printing technique such as a gravure process.

A slipping layer may be used on the back side of the dye-donor element of the invention to prevent the printing head from sticking to the dye-donor element. Such a slipping layer would comprise either a solid or liquid lubricating material or mixtures thereof, with or without a polymeric binder or a surface-active agent. Preferred lubricating materials include oils or semi-crystalline organic solids that melt below 100° C. such as poly(vinyl stearate), beeswax, perfluorinated alkyl ester polyethers, poly-caprolactone, silicone oil, poly(tetrafluoroethylene), carbowax, poly(ethylene glycols), or any of those materials disclosed in U.S. Pat. Nos. 4,717,711; 4,717,712; 4,737,485; and 4,738,950. Suitable polymeric binders for the slipping layer include poly (vinyl alcohol-co-butyral), poly(vinyl alcohol-co-acetal), polystyrene, poly(vinyl acetate), cellulose acetate butyrate, cellulose acetate propionate, cellulose acetate or ethyl cellulose.

The amount of the lubricating material to be used in the slipping layer depends largely on the type of lubricating material, but is generally in the range of about 0.001 to about 2 g/$m^2$. If a polymeric binder is employed, the lubricating material is present in the range of 0.05 to 50 weight %, preferably 0.5 to 40 weight %, of the polymeric binder employed.

Any material can be used as the support for the dye-donor element of the invention provided it is dimensionally stable and can withstand the heat of the thermal printing heads. Such materials include polyesters such as poly(ethylene terephthalate); polyamides; polycarbonates; glassine paper; condenser paper; cellulose esters such as cellulose acetate; fluorine polymers such as poly(vinylidene fluoride) or poly (tetrafluoroethylene-co-hexafluoropropylene); polyethers such as polyoxymethylene; polyacetals; polyolefins such as polystyrene, polyethylene, polypropylene or methylpentene polymers; and polyimides such as polyimide amides and polyetherimides. The support generally has a thickness of from about 2 to about 30 $\mu$m.

The dye-receiving element that is used with the dye-donor element of the invention usually comprises a support having thereon a dye image-receiving layer. The support may be a transparent film such as a poly(ether sulfone), a polyimide, a cellulose ester such as cellulose acetate, a poly(vinyl alcohol-co-acetal) or a poly(ethylene terephthalate). The support for the dye-receiving element may also be reflective such as baryta-coated paper, polyethylene-coated paper, white polyester (polyester with white pigment incorporated therein), an ivory paper, a condenser paper or a synthetic paper such as DuPont Tyvek®.

The dye image-receiving layer may comprise, for example, a polycarbonate, a polyurethane, a polyester, poly (vinyl chloride), poly(styrene-co-acrylonitrile), polycaprolactone or mixtures thereof. The dye image-receiving layer may be present in any amount that is effective for the intended purpose. In general, good results have been obtained at a concentration of from about 1 to about 5 g/$m^2$.

As noted above, the dye donor elements of the invention are used to form a dye transfer image. Such a process comprises imagewise heating a dye-donor element as described above and transferring a dye image to a dye receiving element to form the dye transfer image. After the dye image is transferred, the protection layer is then transferred on top of the dye image.

The dye donor element of the invention may be used in sheet form or in a continuous roll or ribbon. If a continuous roll or ribbon is employed, it may have only one dye or may have alternating areas of other different dyes, such as sublimable cyan and/or magenta and/or yellow and/or black or other dyes. Such dyes are disclosed in U.S. Pat. Nos. 4,541,830; 4,698,651; 4,695,287; 4,701,439; 4,757,046; 4,743,582; 4,769,360 and 4,753,922, the disclosures of which are hereby incorporated by reference. Thus, one-, two-, three- or four-color elements (or higher numbers also) are included within the scope of the invention.

In a preferred embodiment of the invention, the dye-donor element comprises a poly(ethylene terephthalate) support coated with sequential repeating areas of yellow, cyan and magenta dye, and the protection layer noted above, and the above process steps are sequentially performed for each color to obtain a three-color dye transfer image with a protection layer on top. Of course, when the process is only performed for a single color, then a monochrome dye transfer image is obtained.

Thermal printing heads that can be used to transfer dye from the dye-donor elements of the invention are available commercially. There can be employed, for example, a Fujitsu Thermal Head FTP-040 MCSOO1, a TDK Thermal Head LV5416 or a Rohm Thermal Head KE 2008-F3.

A thermal dye transfer assemblage of the invention comprises (a) a dye-donor element as described above, and (b) a dye-receiving element as described above, the dye receiving element being in a superposed relationship with the dye donor element so that the dye layer of the donor element is in contact with the dye image-receiving layer of the receiving element.

The above assemblage comprising these two elements may be preassembled as an integral unit when a monochrome image is to be obtained. This may be done by temporarily adhering the two elements together at their margins. After transfer, the dye-receiving element is then peeled apart to reveal the dye transfer image.

When a three-color image is to be obtained, the above assemblage is formed on three occasions during the time when heat is applied by the thermal printing head.

After the first dye is transferred, the elements are peeled apart. A second dye-donor element (or another area of the donor element with a different dye area) is then brought in register with the dye-receiving element and the process is repeated. The third color is obtained in the same manner. Finally, the protection layer is applied on top.

EXAMPLES

The original coating formulation, (example 1) is made up of 7.1% by weight of Polyvinylacetal (KS-1, Sekisui Co), 0.71% of Butvar B-76 (polyvinylbutyral, Solutia Chemical), 13.4% Colloidal silica (MA-ST-M, Nissan Chemical) and 5.3% of Expancel 461-20-DU (Expancel, Inc). The following materials were tested by adding to the original coating formulation:

I-1—Olin 10 G is a product of Olin Chemicals reported to be a reaction product of a a nonyl phenol with an average of 10 units of glycidol containing as a principal component a nonyl phenol linked to a polypropylene oxide backbone chain with 3 or more hydroxy groups appended to the backbone. 0.5–1% by weight of Olin 10G was stirred into the original coating formulation.

I-2—APG 325CS Glycoside is a product of Henkel Corporation reported to be an alkyl polyglycoside nonionic surfactant having an average alkyl chain length of about 10 carbon atoms, an HLB of 13.1 and form 1 to 4 glycoside units. 0.5% by weight of APG 325CS was stirred into the original coating formulation.

I-3—Solsperse 24000 is a product of ICI, Zeneca Inc. reported to be a poly ($C_{2-4}$-alkyleneimine) carrying at least two mono- or poly-(carbonyl-$C_{1-7}$-alkyleneoxy) groups as more full described in U.S. Pat. No. 5,395,743, col. 3–5. 1.6% by weight of solsperse 24000 was stirred into the original coating formulation C-1—Pluronic L-44 is a product of BASF Corp reported to be a block copolymer of polyethleneoxide and polypropyleneoxide with no hydroxy groups on the backbone (other than end groups. 2% by weight of Pluronic L-44 was added to the original coating formulation.

C-2—Triton N101 is a product of Rohm and Haas reported to be a polyethylene oxide nonylphenol nonionic surfactant having a chain of 9–10 ethleneoxide units. 0.5–2% by weight of Triton N101 was added to the original coating formulation.

The method used to determine the propensity of a formulation to form the contamination related defect on the thermal print is based on a correlation between the lengths of coating footage or time at which the defect first manifests itself and a visual observation of the appearance of a buildup on the coating cylinder. Production data indicates that the defect first appears typically after about 45 minutes from the start of the production event. A high-speed digital video camera was setup on a pilot machine to take images of the coating cylinder surface at 5-minute intervals. For a typical formulation the time at which the contamination was first observed was also found to be an average of 45 minutes. Moreover visual observation of the production coating cylinder surface, upon the occurrence of the contamination defect, also showed the same visual pattern and material of buildup, as was confirmed by IR analysis of the residue on the surface.

The time at which the coating cylinder first appears to have a buildup was used as a relative measure of the propensity of a composition to cause the contamination defect. The greater the length of time, the better. Any time period beyond 2 hrs would provide an acceptable solution to the problem. The table below summarizes the impact of the materials on the time until scum appeared.

TABLE

| Example | Type | Material added | Time until defect appears |
|---|---|---|---|
| 1 | Comp. | None | 45 min. |
| 2 | Comp | (.5–2%) C-2 | 30–45 min |
| 3 | Comp | 2% C-1 | 45 min. |
| 4 | Comp | >5% Polyethylene glycol | 45 min. |
| 5 | Inv. | (i) .5% I-1 | (i) 1.75 hr. |
| 6 | Inv | (ii) 1% I-1 | ii) >4 hr. |
| 7 | Inv | I-2 | >2.25 hr. |
| 8 | Inv | 1.6% I-3 | 2.5 hr. |

As summarized in the table above, we found that the surfactants useful in the invention, with a non-end-group hydrogen bonding group directly or indirectly bonded to the backbone chain of the polymer, were effective in reducing the rate of contamination of the cylinder surface when added to the constituents of the melt used to create the protective overcoat for thermal prints. Other surfactant materials such as C-1 and C-2 did not provide the desired advantage.

The entire contents of the patents and other publications referred to in this specification are incorporated herein by reference.

What is claimed is:

1. A thermal dye sublimation transfer image comprising a transparent overcoat comprising a protective solvent-soluble polymer and an effective amount of a surfactant compound, for preventing scumming of a gravure cylinder when depositing a liquid coating melt of the overcoat on a substrate by a gravure process, said surfactant having multiple non-end-group hydrogen bonding groups directly or indirectly bonded to the backbone chain of the surfactant compound.

2. The image of claim 1 wherein the hydrogen bonding group comprises a hydroxy group.

3. The image of claim 1 wherein the hydrogen bonding group comprises a secondary amine group.

4. The image of claim 1 wherein the compound comprises a poly(hydroxyalkyleneoxide) segment.

5. The image of claim 4 wherein the compound is also an alkylphenol derivative.

6. The image of claim 5 wherein the compound is an octyl- or nonylphenol derivative.

7. The image of claim 4 wherein the poly (hydroxyalkyleneoxide) segment contains at least 6 hydroxyalkyleneoxide groups.

8. The image of claim 7 wherein the compound contains at least 9 hydroxyalkyleneoxide groups.

9. The image of claim 8 wherein the compound is a nonylphenol derivative.

10. The image of claim 1 wherein the compound is a nonionic sugar derivative.

11. The image of claim 10 wherein the sugar derivative is an alkyl polyglycoside compound.

12. The image of claim 11 wherein the derivative contains an alkyl chain of 8 carbon atoms.

13. The image of claim 11 wherein the derivative contains an alkyl chain of from 8 to 16 carbon atoms.

14. The image of claim 11 wherein the derivative contains from 1 to 4 glycoside rings.

15. The image of claim 12 wherein the derivative has an HLB of from 11 to 14.

16. The image of claim 10 wherein the compound is a sorbitol or mannitol derivative.

17. The image of claim 1 wherein the compound is a polyalkyleneimine.

18. The image of claim 17 wherein the polyalkyleneimine contains alkyleneimine groups of 2–4 carbon atoms.

19. The image of claim 18 wherein the polyalkyleneimine also contains a poly(carbonylalkyleneoxy) group.

20. The image of claim 17 wherein the compound is a polyethyleneimine.

21. The image of claim 17 wherein the molecular weight of the compound is from 1,000 to 200,000.

22. The image of claim 17 wherein the molecular weight of the compound is from 10,000 to 50,000.

23. The image of claim 17 wherein the molecular weight of the compound is from 20,000 to 30,000.

24. The image of claim 1 further containing microspheres bearing inorganic particles in an amount of at least 1.8% by weight of the microspheres.

25. The image of claim 24 wherein the inorganic particles comprise silica particles.

* * * * *